(12) United States Patent
Chen et al.

(10) Patent No.: US 10,553,527 B2
(45) Date of Patent: Feb. 4, 2020

(54) SUBSTRATE AND SEMICONDUCTOR DEVICE PACKAGE

(71) Applicant: Advanced Semiconductor Engineering, Inc., Kaohsiung (TW)

(72) Inventors: Dao-Long Chen, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/702,700

(22) Filed: Sep. 12, 2017

(65) Prior Publication Data

US 2019/0080993 A1    Mar. 14, 2019

(51) Int. Cl.
*H01L 23/498* (2006.01)
*H01L 23/29* (2006.01)
*H01L 23/00* (2006.01)

(52) U.S. Cl.
CPC ...... *H01L 23/49811* (2013.01); *H01L 23/295* (2013.01); *H01L 24/16* (2013.01); *H01L 24/09* (2013.01); *H01L 2224/16227* (2013.01)

(58) Field of Classification Search
CPC . H01L 23/49811; H01L 23/295; H01L 24/16; H01L 24/09; H01L 2224/16227
See application file for complete search history.

(56) References Cited

U.S. PATENT DOCUMENTS

| | | | |
|---|---|---|---|
| 2008/0272500 A1* | 11/2008 | Ishio | H01L 23/3114 257/782 |
| 2013/0154090 A1* | 6/2013 | Choi | H01L 21/565 257/737 |
| 2017/0141063 A1 | 5/2017 | Lee et al. | |
| 2017/0162527 A1 | 6/2017 | Kim et al. | |
| 2017/0162540 A1* | 6/2017 | Ji | H01L 24/94 |

* cited by examiner

*Primary Examiner* — Zandra V Smith
*Assistant Examiner* — Andre C Stevenson
(74) *Attorney, Agent, or Firm* — Foley & Lardner LLP; Cliff Z. Liu

(57) ABSTRACT

A substrate including a dielectric layer and a patterned conductive layer adjacent to the dielectric layer is provided. The patterned conductive layer comprises a first conductive pad, the first conductive pad comprises a first portion having a first concave sidewall. The substrate further includes a protection layer disposed on the patterned conductive layer, and the protection layer covers the first portion of the first conductive pad.

25 Claims, 19 Drawing Sheets

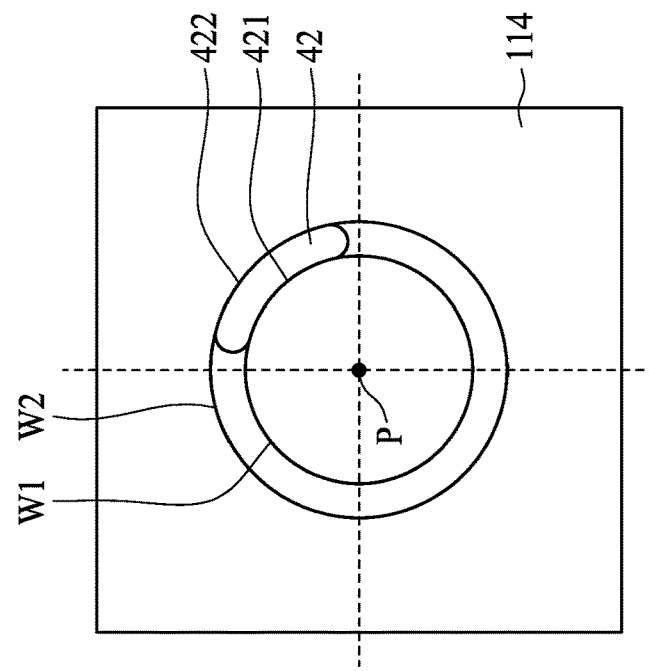
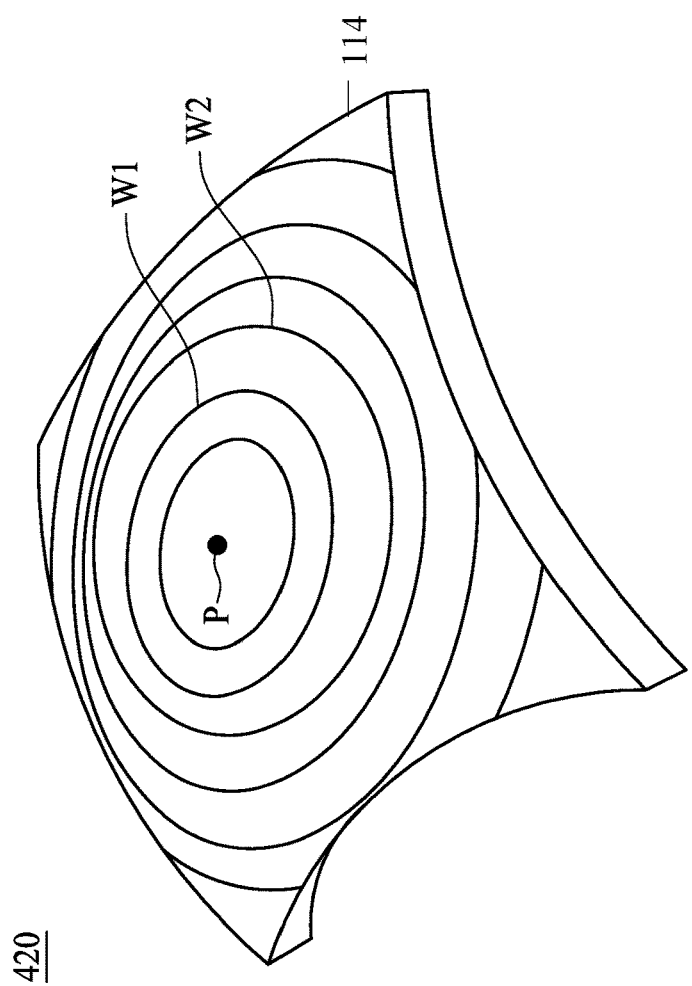
FIG. 4B
FIG. 4A

US 10,553,527 B2

SUBSTRATE AND SEMICONDUCTOR DEVICE PACKAGE

TECHNICAL FIELD

The present disclosure generally relates to a substrate and a semiconductor device package, and more particularly, to a substrate including a conductive pad having a concave sidewall.

BACKGROUND

A semiconductor device package may include at least one semiconductor device mounted on a substrate having circuitry. The circuitry of the substrate may include conductive traces and/or conductive pads. The conductive pads may be electrically connected to the semiconductor device. Solder mask is used to cover the conductive traces and/or portions of peripheral areas of the conductive pads for protection. Moreover, solder mask can also control warpage of the semiconductor device package.

However, structural defects, e.g. crack or delamination, may occur around or at boundaries between the conductive pads and the solder mask due to a mismatch of coefficients of thermal expansion (CTEs) or warpage during thermal cycles of the manufacturing process. The crack or delamination between the conductive pad and the solder mask may cause reliability issue. For example, the solder for joining conductive pads of the semiconductor device to the conductive pads of the substrate may flow into the crack and make contact with nearby circuits, resulting in short circuit. The solder flowing into the crack may also aggravate the crack issue.

SUMMARY

In some embodiments, according to one aspect, a substrate is disclosed. The substrate comprises a dielectric layer and a patterned conductive layer adjacent to the dielectric layer. The patterned conductive layer comprises a first conductive pad, and the first conductive pad comprises a first portion having a first concave sidewall. The substrate further includes a protection layer disposed on the patterned conductive layer, and the protection layer covers the first portion of the first conductive pad.

In some embodiments, according to another aspect, a semiconductor device package is disclosed. The semiconductor device package includes a substrate and a semiconductor device on the substrate. The substrate includes a dielectric layer and a patterned conductive layer adjacent to the dielectric layer. The patterned conductive layer comprises a first conductive pad and the first conductive pad comprises a first portion having a concave sidewall. The semiconductor device on the substrate is electrically connected to the first conductive pad of the patterned conductive layer. The semiconductor device package further includes a conductive connection element electrically connected between the semiconductor device and the first conductive pad of the patterned conductive layer.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

FIG. 4A is a schematic diagram of a warped area of a substrate for receiving a semiconductor device according to some embodiments of the present disclosure.

FIG. 4B is a schematic diagram illustrating a top view of a portion of a substrate according to some embodiments of the present disclosure.

DETAILED DESCRIPTION

Figure 1A:
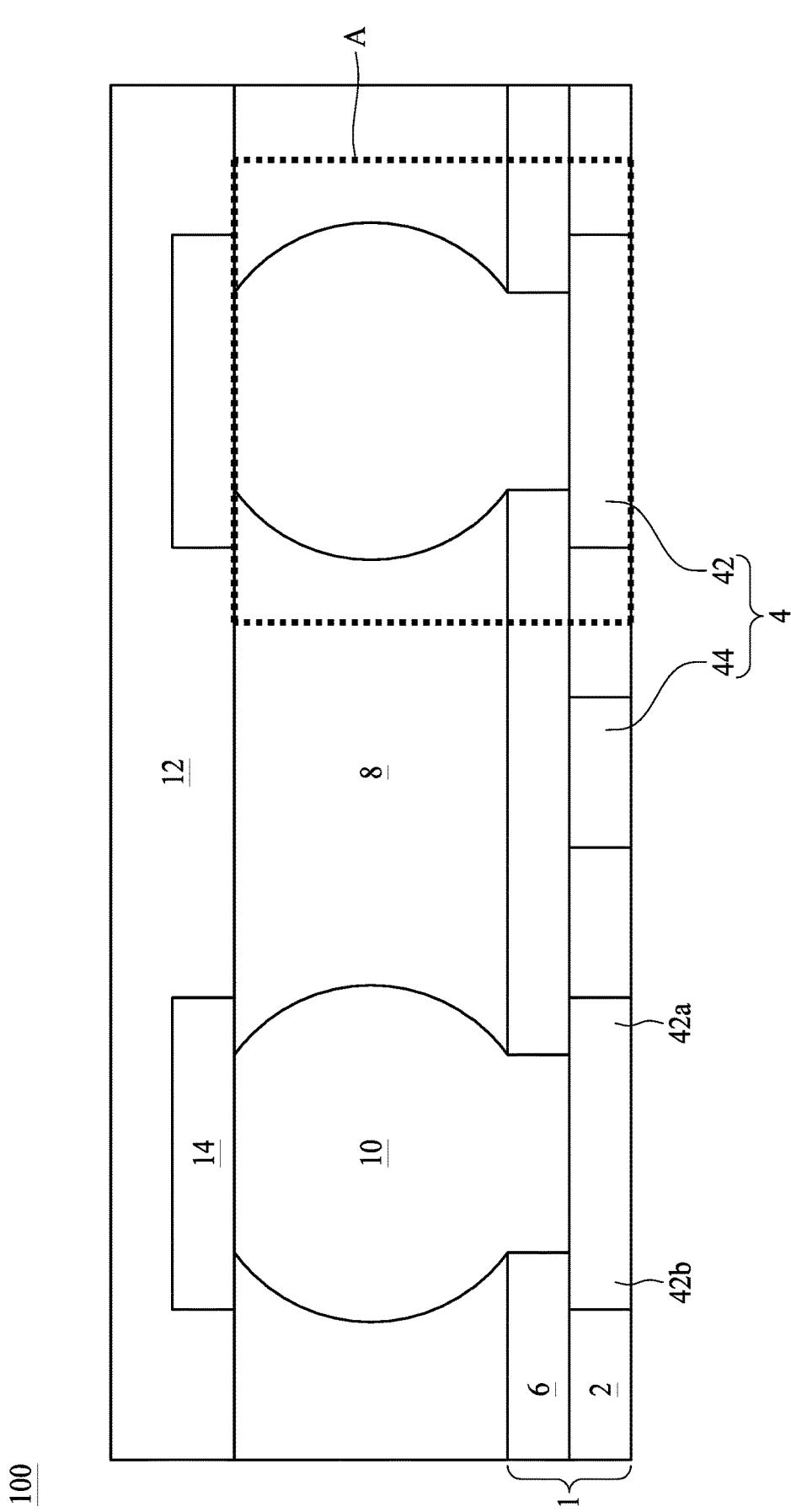
FIG. 1A is a schematic diagram illustrating a cross-sectional view of a semiconductor device package including a substrate according to some embodiments of the present disclosure.

Manufacturing and use of the embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

In a semiconductor device package according to some embodiments of the present disclosure, a conductive pad having a concave sidewall is provided. The concave sidewall is disposed according to a warpage contour of an area (on a substrate) to receive a semiconductor device. The conductive pad having the concave sidewall can mitigate a crack issue.

FIG. 1A is a schematic diagram illustrating a cross-sectional view of a semiconductor device package including a substrate according to some embodiments of the present disclosure. Referring to FIG. 1A, the semiconductor device package 100 comprises a substrate 1. The substrate 1 comprises a dielectric layer 2, a patterned conductive layer 4 and a protection layer 6. The semiconductor device package 100 further comprises an encapsulation layer 8, a conductive connection element 10, and a semiconductor device 12. A number of conductive pads 14 may be disposed on an active side (e.g., bottom side) of the semiconductor device 12.

The patterned conductive layer 4 is adjacent to the dielectric layer 2. The patterned conductive layer 4 includes a number of conductive pads 42 and traces 44. The substrate 1 comprises an area (not shown in FIG. 1A) to receive the semiconductor device 12. The conductive pads 42 are disposed within the area. Each of the conductive pads 42 includes a first portion 42a and a second portion 42b. In some embodiments, the first portion 42a has a concave sidewall. In some embodiments, the second portion 42b has a convex sidewall. The protection layer 6 is disposed on the dielectric layer 2 and the patterned conductive layer 4. The protection layer 6 covers the first portion 42a and the second portion 42b. In some embodiments, the protection layer 6 comprises a resin. In some embodiments, a material of the protection layer 6 may be organic or inorganic. For example, the material of the protection layer 6 may include, e.g., a solder mask.

The encapsulation layer 8 is disposed between the protection layer 6 and the semiconductor device 12. In some embodiments, the encapsulation layer 8 comprises a resin and fillers. In some embodiments, a material of the encapsulation layer 8 may be organic or inorganic. For example, the material of the encapsulation layer 8 may include, e.g., a glass-reinforced epoxy resin material, bismaleimide triazine (BT), epoxy, silicon, glass, ceramic, or a combination of two or more thereof. Referring to FIG. 1A, a number of conductive connection elements 10 may be disposed to contact the conductive pads 14 of the semiconductor device 12 and the conductive pads 42 of the substrate 1. The active side of the semiconductor device 12 is electrically connected to the conductive pads 42 of the substrate 1 through the conductive connection elements 10.

Figure 1B:
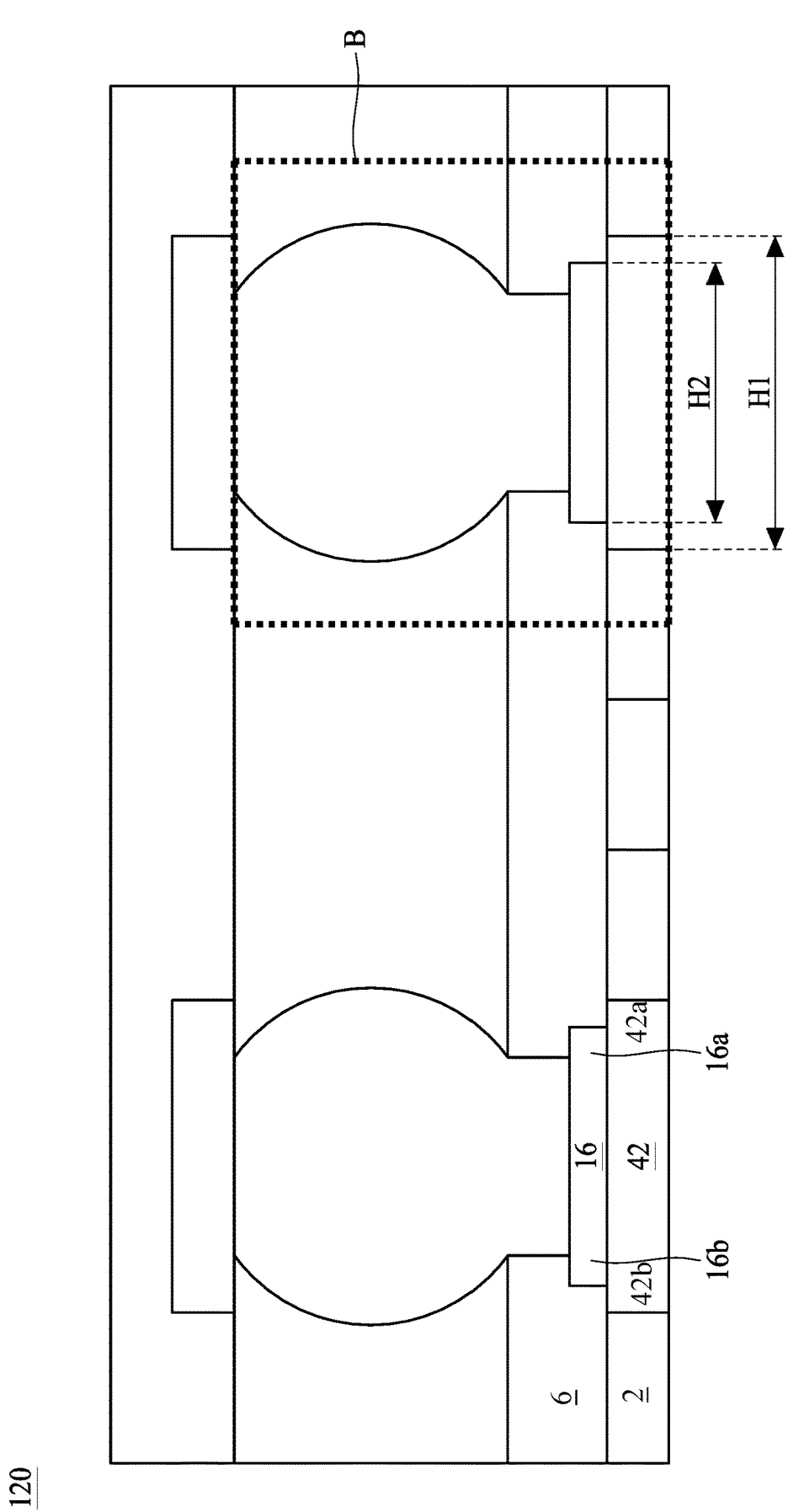
FIG. 1B is a schematic diagram illustrating a cross-sectional view of a semiconductor device package including a substrate according to some embodiments of the present disclosure.

FIG. 1B is a schematic diagram illustrating a cross-sectional view of a semiconductor device package including a substrate according to some embodiments of the present disclosure. The semiconductor device package 120 shown in FIG. 1B is similar to the semiconductor device package 100 of FIG. 1A, except that conductive pads 16 are disposed between the conductive connection elements 10 and the conductive pads 42. Each of the conductive pads 16 includes a first portion 16a and a second portion 16b. In some embodiments, the first portion 16a has a concave sidewall. In some embodiments, the second portion 16b has a convex sidewall.

Referring to FIG. 1B, the conductive pad 42 has a width H1 and the conductive pad 16 has a width H2. In some embodiments, the width H1 is different from the width H2. In some embodiments, the width H1 is greater than the width H2, for example, at least about 1.1 times, at least about 1.3 times, or at least about 1.5 times greater. In some other embodiments, the width H1 is substantially equal to the width H2. The protection layer 6 covers the first portion 42a and the second portion 42b. The protection layer 6 covers the first portion 16a and the second portion 16b. In some embodiments, the protection layer 6 comprises a step structure corresponding to the different widths of the conductive pad 42 and the conductive pad 16 as shown in FIG. 1B. In some embodiments, the protection layer 6 surrounds the conductive pad 16. In some embodiments, the protection layer 6 is in contact with at least a portion of a sidewall of the conductive pad 16.

Figure 1C:
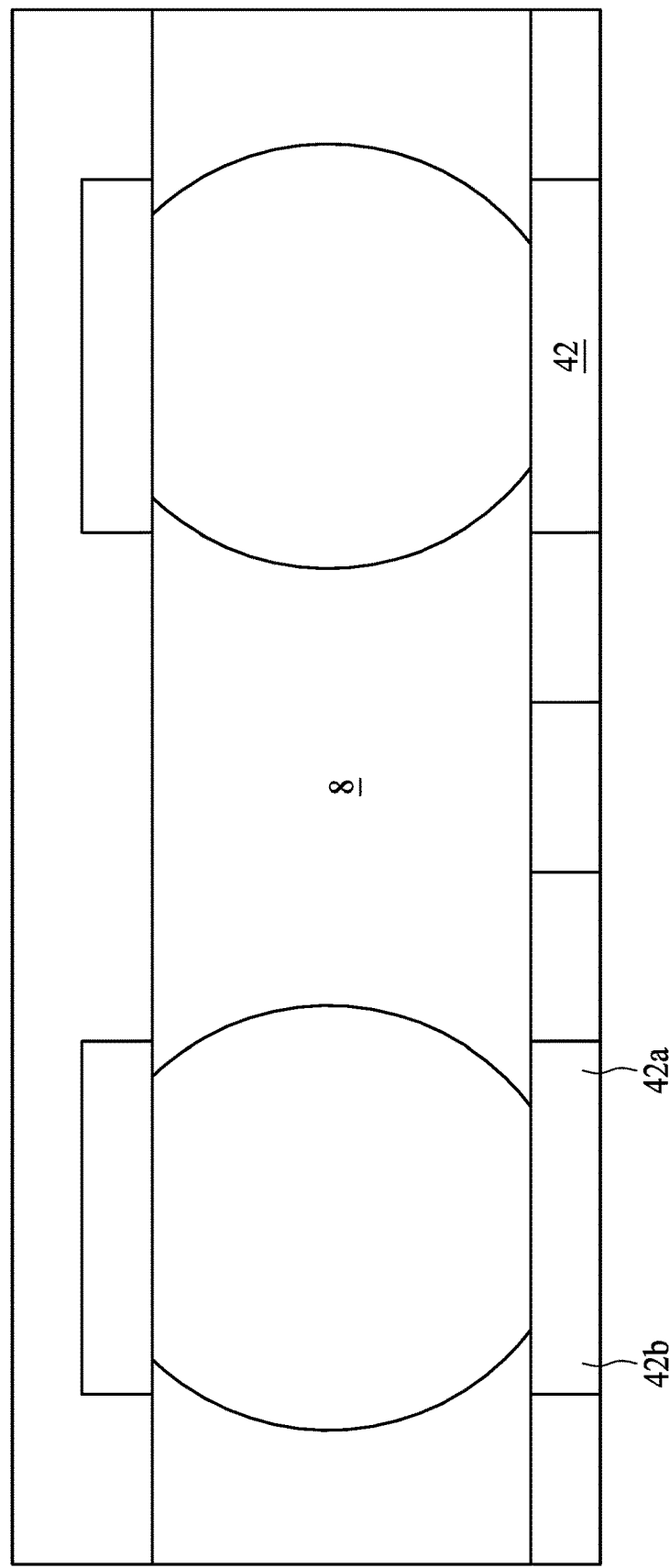
FIG. 1C is a schematic diagram illustrating a cross-sectional view of a semiconductor device package including a substrate according to some embodiments of the present disclosure.

FIG. 1C is a schematic diagram illustrating a cross-sectional view of a semiconductor device package including a substrate according to some embodiments of the present disclosure. Referring to FIG. 1C, the structure of the semiconductor device package 140 is similar to that of semiconductor device package 100 of FIG. 1A, except that the protection layer 6 is omitted. The encapsulation layer 8 covers the conductive pad 42 including the first portion 42a and the second portion 42b.

Figure 1D:
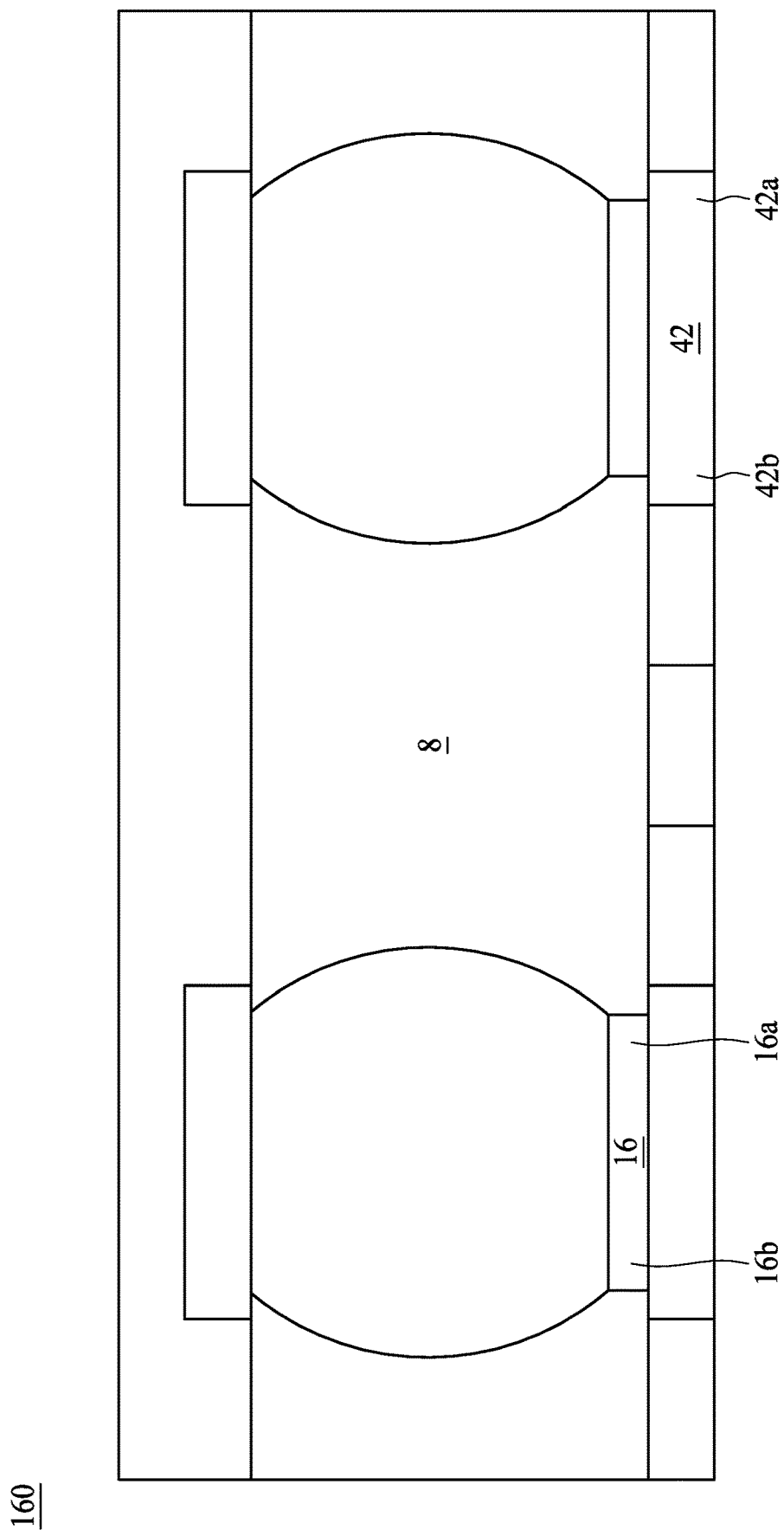
FIG. 1D is a schematic diagram illustrating a cross-sectional view of a semiconductor device package including a substrate according to some embodiments of the present disclosure.

FIG. 1D is a schematic diagram illustrating a cross-sectional view of a semiconductor device package including a substrate according to some embodiments of the present disclosure. Referring to FIG. 1D, the structure of the semiconductor device package 160 is similar to that of semiconductor device package 120 of FIG. 1B, except that the protection layer 6 is omitted. In some embodiments, the encapsulation layer 8 covers the conductive pad 42 including the first portion 42a and the second portion 42b. In some embodiments, the encapsulation layer 8 surrounds the conductive pad 16. In some embodiments, the encapsulation layer 8 is in contact with at least a portion of a sidewall of the conductive pad 16.

Figure 2A:
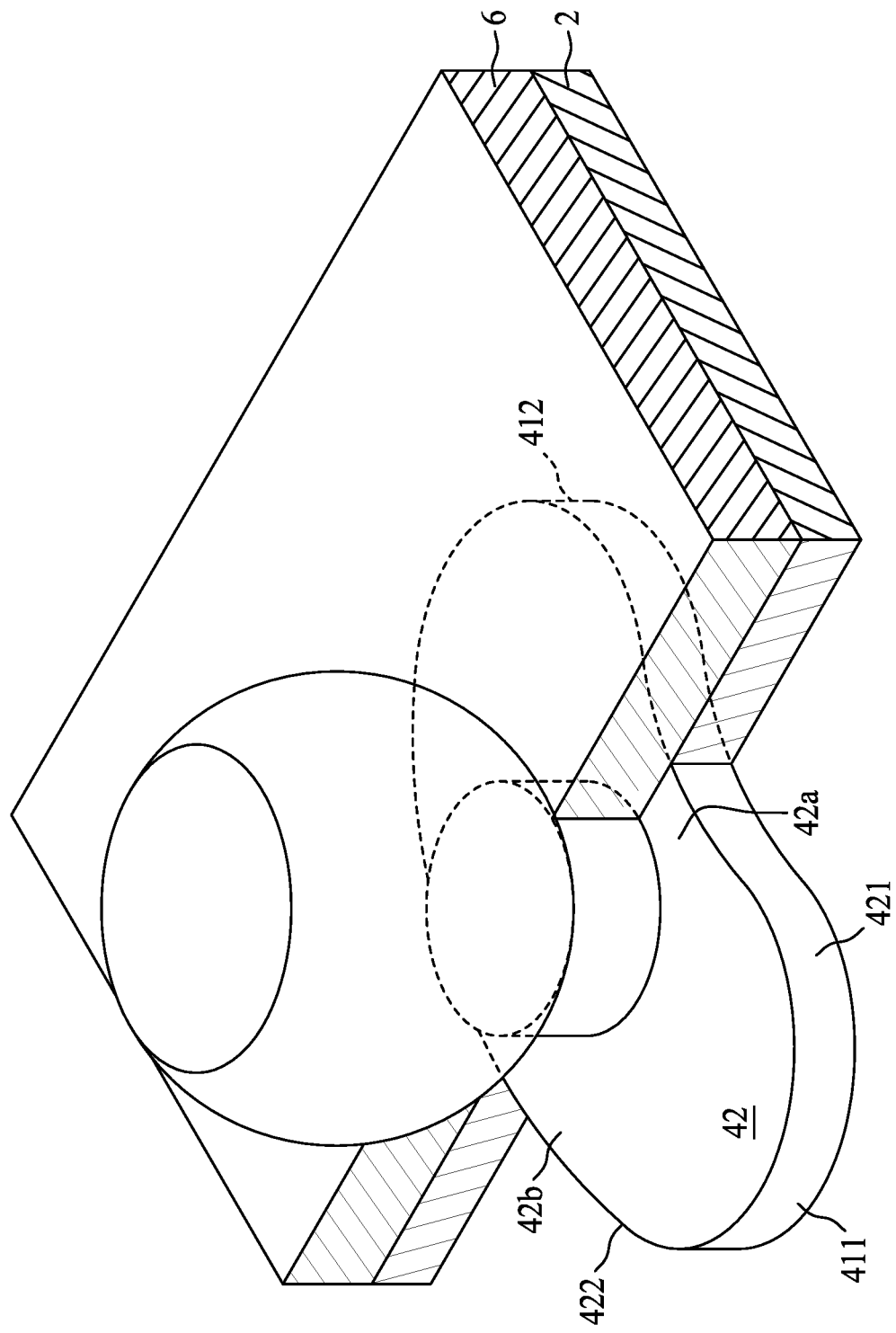
FIG. 2A is a schematic diagram illustrating a three-dimensional perspective view of a portion of a substrate according to some embodiments of the present disclosure.

FIG. 2A is a schematic diagram illustrating a three-dimensional view of a portion of a substrate according to some embodiments of the present disclosure. FIG. 2A illustrates a three-dimensional view of the structure in the dotted box A of FIG. 1A according to some embodiments. Some portions (e.g., halves) of the protection layer 6 and the dielectric layer 2 are not shown in FIG. 2A for illustration purpose. In some embodiments, the dielectric layer 2 surrounds the conductive pad 42, and the protection layer 6 is disposed on the dielectric layer 2 and covers the conductive pad 42 including the first portion 42*a* and the second portion 42*b*. In some embodiments, the material of the dielectric layer 2 may be organic or inorganic. For example, the material of the dielectric layer 2 may include, e.g., a glass-reinforced epoxy resin material (e.g., FR4 grade glass-reinforced epoxy resin), BT, epoxy, silicon, glass, ceramic, or a combination of two or more thereof.

Referring to FIG. 2A, the conductive pad 42 has a concave side wall 421 and a convex side wall 422 opposite the concave side wall 421. In some embodiments, the concave side wall 421 is an arc of a first circle, and the convex side wall 422 is an arc of a second circle that may have a radius different from a radius of the first circle.

Referring again to FIG. 2A, the conductive pad 42 further comprises an end wall 411 and an end wall 412. Each of the end wall 411 and the end wall 412 connects the concave side wall 421 and the convex side wall 422. The end wall 411 is a convex wall having a first radius of curvature. The end wall 412 is a convex wall having a second radius of curvature. In some embodiments, the first radius of curvature is substantially the same as the second radius of curvature. In some embodiments, the first radius of curvature is different from the second radius of curvature. In some embodiments, the end wall 411 has a hemispherical shape. In some embodiments, the end wall 412 has a hemispherical shape.

Figure 2B:
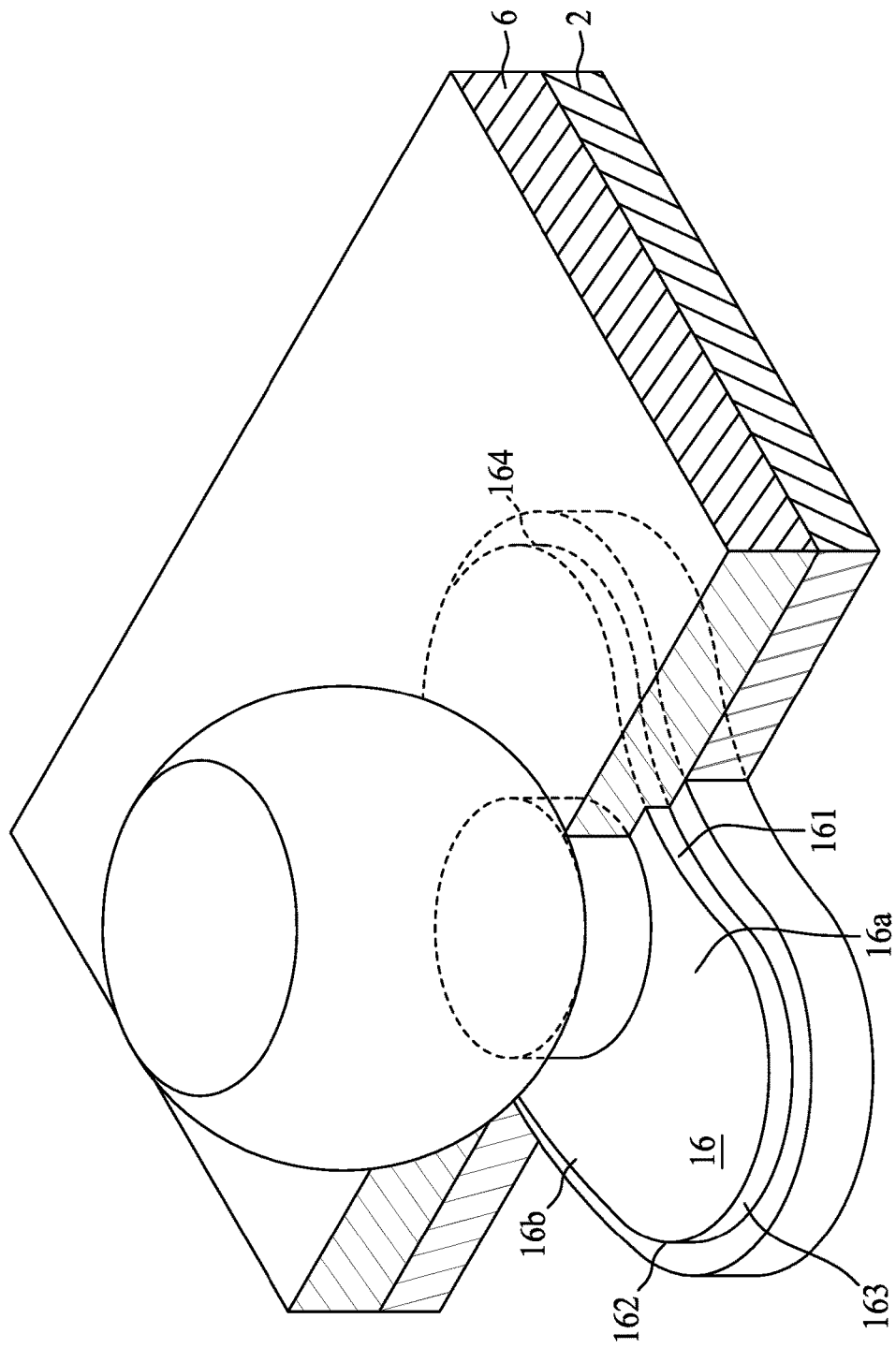
FIG. 2B is a schematic diagram illustrating a three-dimensional perspective view of a portion of a substrate according to some embodiments of the present disclosure.

FIG. 2B is a schematic diagram illustrating a three-dimensional view of a portion of a substrate according to some embodiments of the present disclosure. FIG. 2B illustrates a three-dimensional view of the structure in the dotted box B of FIG. 1B according to some embodiments. Some portions (e.g., halves) of the protection layer 6 and the dielectric layer 2 are not shown in FIG. 2B for illustration purpose. In some embodiments, the dielectric layer 2 surrounds the conductive pad 42 and the conductive pad 16, and the protection layer 6 is disposed on the dielectric layer 2 and covers the first portion 42*a* and the second portion 42*b* of the conductive pad 42 and the first portion 16*a* and the second portion 16*b* of the conductive pad 16.

Referring to FIG. 2B, the conductive pad 16 comprises the first portion 16*a* and the second portion 16*b*. In some embodiments, the conductive pad 16 has a concave side wall 161 and a convex side wall 162 opposite the concave side wall 161. In some embodiments, the concave side wall 161 is an arc of a first circle, and the convex side wall 162 is an arc of a second circle that may have a radius different from a radius of the first circle.

Referring again to FIG. 2B, the conductive pad 16 further comprises an end wall 163 and an end wall 164. Each of the end wall 163 and the end wall 164 connects the concave side wall 161 and the convex side wall 162. The end wall 163 is a convex wall having a first radius of curvature. The end wall 164 is a convex wall having a second radius of curvature. In some embodiments, the first radius of curvature is substantially the same as the second radius of curvature. In some embodiments, the first radius of curvature is different from the second radius of curvature. In some embodiments, the end wall 163 has a hemispherical shape. In some embodiments, the end wall 164 has a hemispherical shape.

Figure 2C:
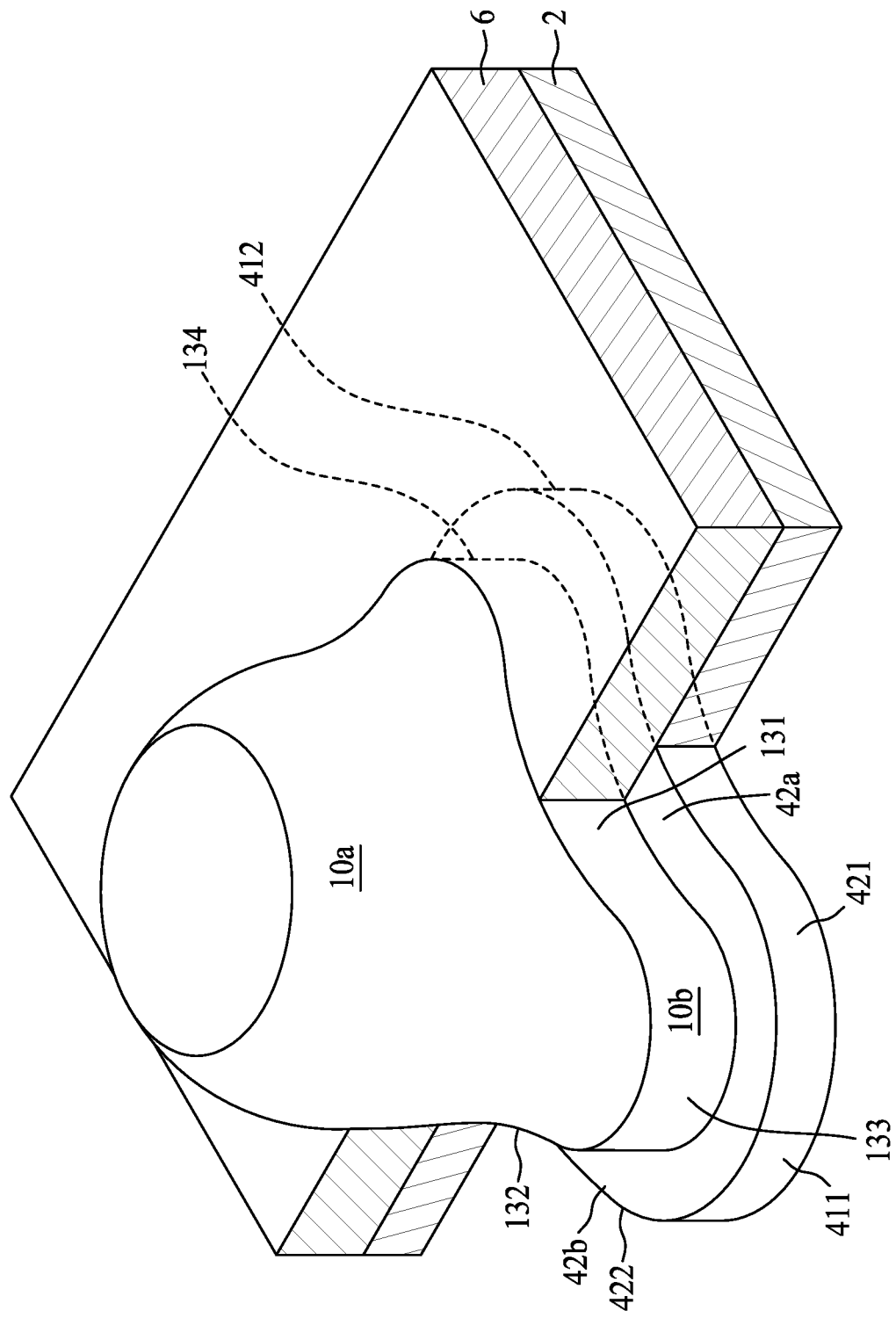
FIG. 2C is a schematic diagram illustrating a three-dimensional perspective view of a portion of a substrate according to some embodiments of the present disclosure.

FIG. 2C is a schematic diagram illustrating a three-dimensional view of a portion of a substrate according to some embodiments of the present disclosure. FIG. 2C illustrates a three-dimensional view of the structure in the dotted box A of FIG. 1A according to some embodiments. In some embodiments, the conductive connection element 10 comprises a portion 10*a* and a portion 10*b*. In some embodiments, the portion 10*b* has a concave side wall 131 and a convex side wall 132 opposite the concave side wall 131. In some embodiments, the concave side wall 131 is an arc of a first circle, and the convex side wall 132 is an arc of a second circle that may have a radius different from a radius of the first circle.

Referring again to FIG. 2C, the second portion 10*b* further comprises an end wall 133 and another end wall 134. Each of the end wall 133 and the end wall 134 connects the concave side wall 131 and the convex side wall 132. The end wall 133 is a convex wall having a first radius of curvature. The end wall 134 is a convex wall having a second radius of curvature. In some embodiments, the first radius of curvature is substantially the same as the second radius of curvature. In some embodiments, the first radius of curvature is different from the second radius of curvature. In some embodiments, the end wall 133 has a hemispherical shape. In some embodiments, the end wall 134 has a hemispherical shape.

Figure 2D:
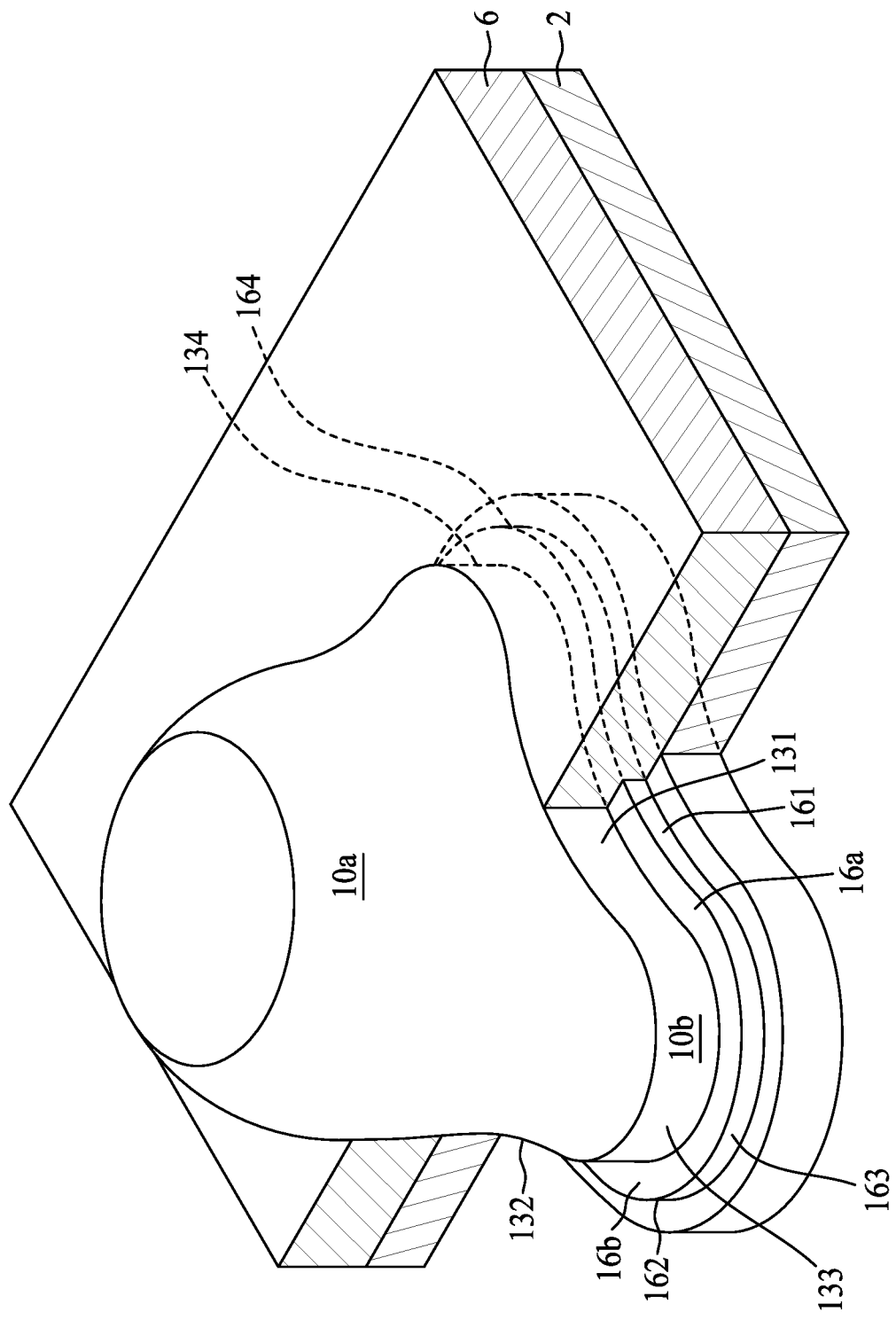
FIG. 2D is a schematic diagram illustrating a three-dimensional perspective view of a portion of a substrate according to some embodiments of the present disclosure.

FIG. 2D is a schematic diagram illustrating a three-dimensional view of a portion of a substrate according to some embodiments of the present disclosure. FIG. 2D illustrates a three-dimensional view of the structure in the dotted box B of FIG. 1B according to some embodiments. In some embodiments, the conductive connection element 10 comprises a portion 10*a* and a portion 10*b*. In some embodiments, the portion 10*b* has a concave side wall 131 and a convex side wall 132 opposite the concave side wall 131. In some embodiments, the concave side wall 131 is an arc of a first circle, and the convex side wall 132 is an arc of a second circle that may have a radius different from a radius of the first circle.

Referring again to FIG. 2D, the portion 10*b* further comprises an end wall 133 and another end wall 134. Each of the end wall 133 and the end wall 134 connects the concave side wall 131 and the convex side wall 132. The end wall 133 is a convex wall having a first radius of curvature. The end wall 134 is a convex wall having a second radius of curvature. In some embodiments, the first radius of curvature is substantially the same as the second radius of curvature. In some embodiments, the first radius of curvature is different from the second radius of curvature. In some embodiments, the end wall 133 has a hemispherical shape. In some embodiments, the end wall 134 has a hemispherical shape.

Figure 3:
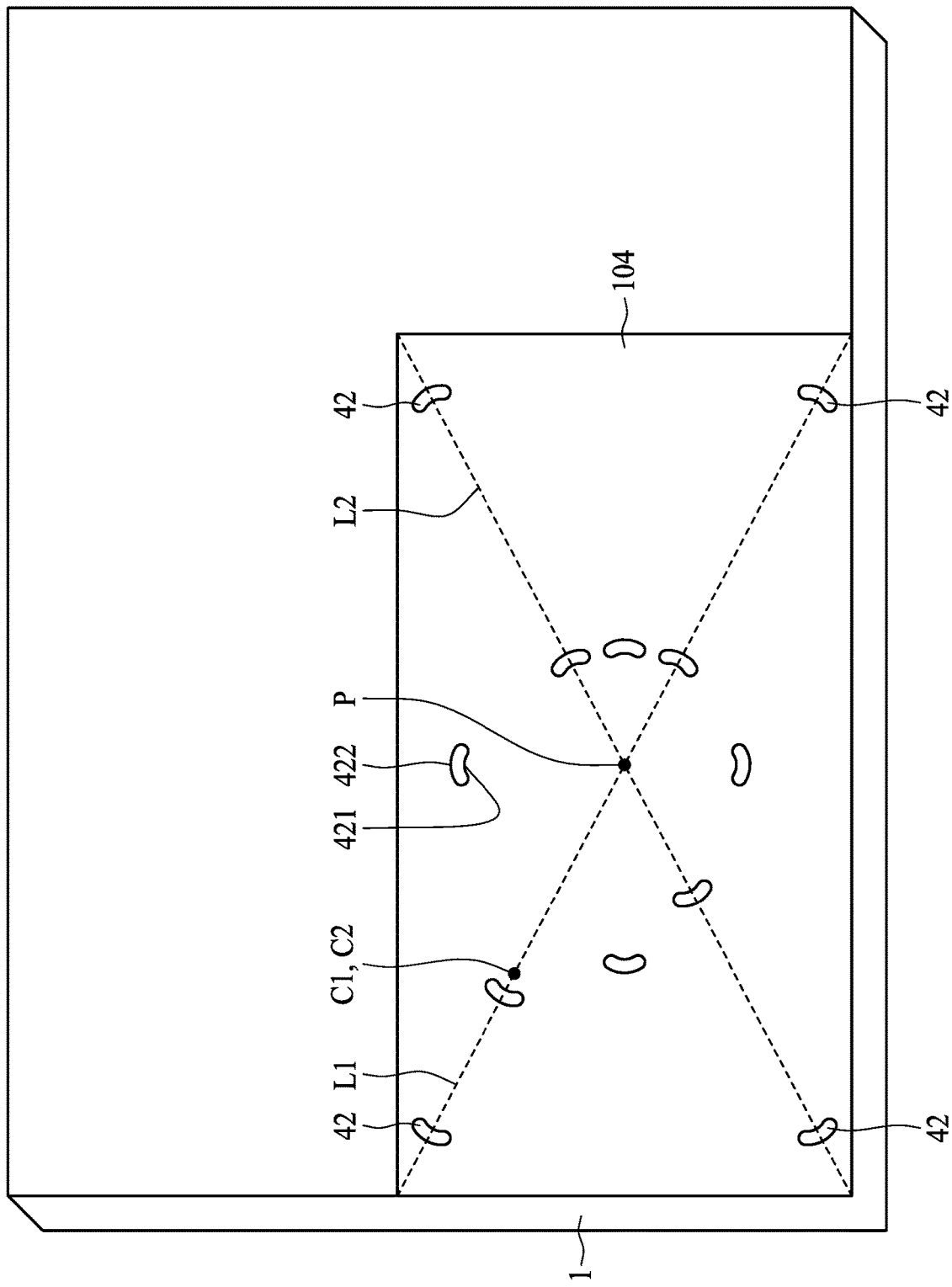
FIG. 3 is a schematic diagram illustrating a substrate including an area for receiving a semiconductor device according to some embodiments of the present disclosure.

FIG. 3 is a schematic diagram illustrating a substrate including an area for receiving a semiconductor device according to some embodiments of the present disclosure. Referring to FIG. 3, the substrate 1 comprises an area 104 for receiving a semiconductor device, and a number of conductive pads 42 disposed within the area 104. In some embodiments, the semiconductor device and the area 104 have a dimension equal to or greater than, e.g., about 450 square millimeter ($mm^2$), about 600 $mm^2$, or about 800 $mm^2$.

The conductive pads 42 may be used as electrical connections to the semiconductor device (not shown in FIG. 3). Some of the conductive pads 42 are disposed close to corners of the area 104, some are disposed on a diagonal line (denoted as L1 and L2 for reference) of the area 104, and some are disposed at other positions on the area 104.

Each of the conductive pads 42 is arranged such that the concave side wall 421 is closer to a geometric center P of the area 104 than is the convex side wall 422. That is, the concave side walls 421 of the conductive pads 42 face the geometric center P of the area 104. In some embodiments, a center C1 of curvature of the concave side wall 421 falls on the diagonal L1 or L2 of the area 104. In some embodiments, a center C2 of curvature of the convex side wall 422 falls on the diagonal L1 or L2 of the area 104. In some embodiments, the center of curvature (also referred to as curvature center) of the concave side wall 421 and the center of curvature of the convex side wall 422 may be concentric or non-concentric. In some embodiments, each of the conductive pads 42 have the centers of curvature of the concave side wall 421 and the convex side wall 422 falling on a line extending through the geometric center P of the area 104, although in other embodiments, some conductive pads 42 may be oriented differently. Further, the centers of curvature of the concave side wall 421 and the convex side wall 422 may not be aligned with each other, as seen, for example, in FIGS. 6 and 8, discussed below. In some embodiments, the centers of curvature of the concave side walls 421 of multiple conductive pads 42 may fall on the same line extending through the geometric center P of the area 104. That is, the centers of curvature of the concave side walls 421 of multiple conductive pads 42 may be concentric.

FIG. 4A illustrates a diagram of a warped area of a substrate for receiving a semiconductor device according to some embodiments of the present disclosure. Referring to FIG. 4A, the warpage diagram 420 of the area 114 can be generated by, for example, computer simulation software before a semiconductor device is mounted on the area 114. In some embodiments, the area 114 has a substantial rectangular or square shape with a geometric center P. It is contemplated that the area 114 may include shapes other than the above. Referring to FIG. 4A, the warpage diagram 420 shows that the area 114 may have a concave structure (e.g. the geometric center P may be at or close to the top portion of the area 114) during or subsequent to thermal cycles of the manufacturing process. The warpage diagram 420 illustrates that stress mismatch may occur around or adjacent to the central portion (e.g. the geometric center P) of the area 114.

FIG. 4B is a schematic diagram illustrating a top view of a portion of a substrate according to some embodiments of the present disclosure. Referring to FIG. 4B, the warpage contour W1 includes a circle having a geometric center P. The warpage contour W2 includes a circle having the geometric center P. One or more conductive pads 42 may be designed and disposed along the warpage contours W1 and W2. One or more conductive pads 42 may be arranged to fit the warpage contours W1 and W2. The concave side wall 421 of the conductive pad 42 is disposed closer to the geometric center P than is the convex side wall 422 such that crack that may occur around or at the boundary between the conductive pad 42 and a protection layer can be mitigated or eliminated.

Figure 4C:
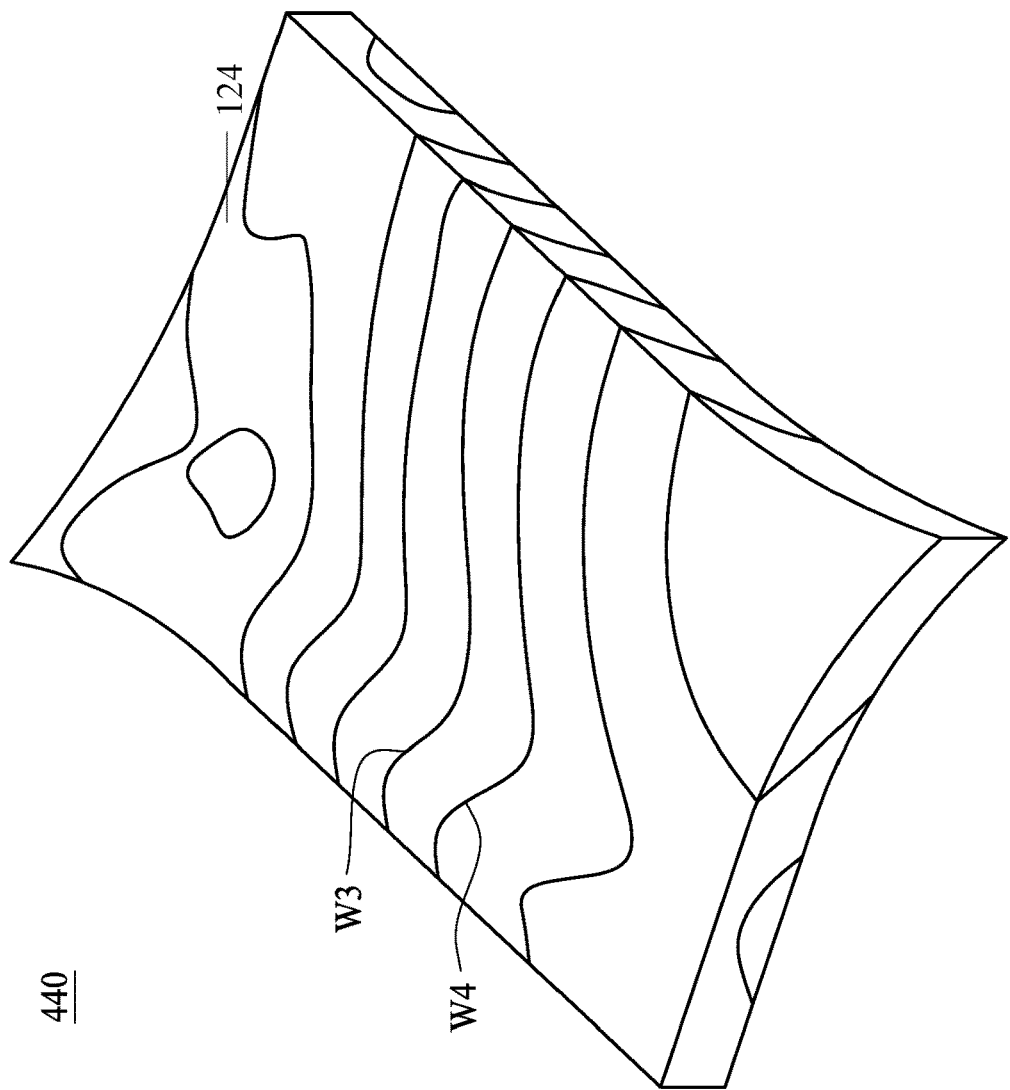
FIG. 4C is a schematic diagram of a warped area of a substrate for receiving a semiconductor device according to some embodiments of the present disclosure.

FIG. 4C illustrates a diagram of a warped area of a substrate for receiving a semiconductor device according to some embodiments of the present disclosure. Referring to FIG. 4C, the warpage diagram 440 of the area 124 can be generated by, for example, computer simulation software before a semiconductor device is mounted on the area 124. In some embodiments, the area 124 has a rectangular shape. It is contemplated that the area 114 may include shapes other than the above. Referring to FIG. 4C, the warpage diagram 440 shows that the area 124 turns up or projects up at the upper left corner during or subsequent to thermal cycles of the manufacturing process. The warpage diagram 440 shows that the area 124 turns down or projects down at the bottom right corner during or subsequent to the thermal cycles of the manufacturing process. The warpage diagram 440 illustrates that stress mismatch may occur around or adjacent to the upper left corner of the area 124. The warpage diagram 440 illustrates that stress mismatch may occur around or adjacent to the bottom right corner of the area 124.

Figure 4D:
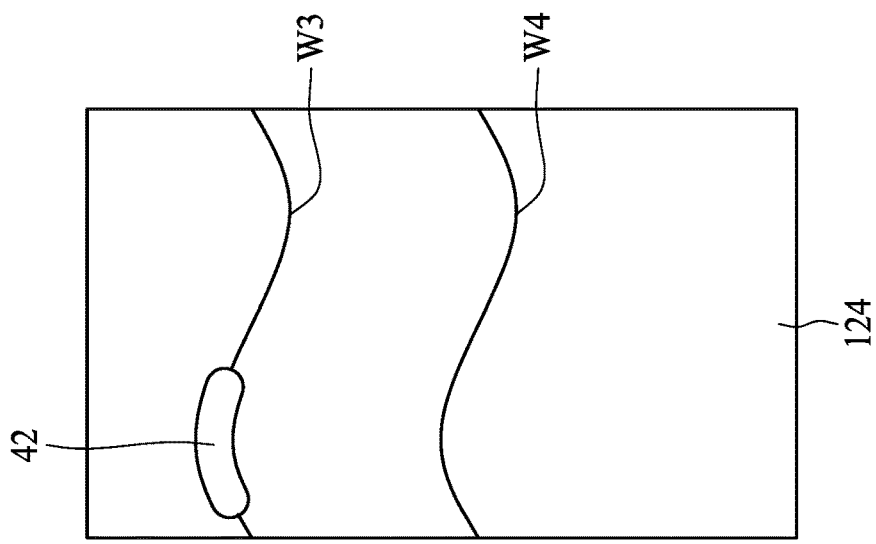
FIG. 4D is a schematic diagram illustrating a top view of a portion of a substrate according to some embodiments of the present disclosure.

FIG. 4D is a schematic diagram illustrating a top view of a portion of a substrate according to some embodiments of the present disclosure. Referring to FIG. 4D, the warpage contour W3 includes a curve. The warpage contour W4 includes a curve. One or more conductive pads 42 may be designed and disposed along the warpage contours W3 and W4. One or more conductive pads 42 may be arranged to fit the warpage contours W3 and W4 such that crack that may occur around or at the boundary between the conductive pad 42 and a protection layer can be mitigated or eliminated. In some embodiments, the conductive pad 42 may have a curvature substantially the same as a curvature of a portion of the warpage contours W3 or W4. In some embodiments, the conductive pad 42 may have a curvature similar to the curvature of a portion of the warpage contours W3 or W4. In some embodiments, the conductive pad 42 may have a curvature different from the curvature of a portion of the warpage contours W3 or W4.

Figure 5:
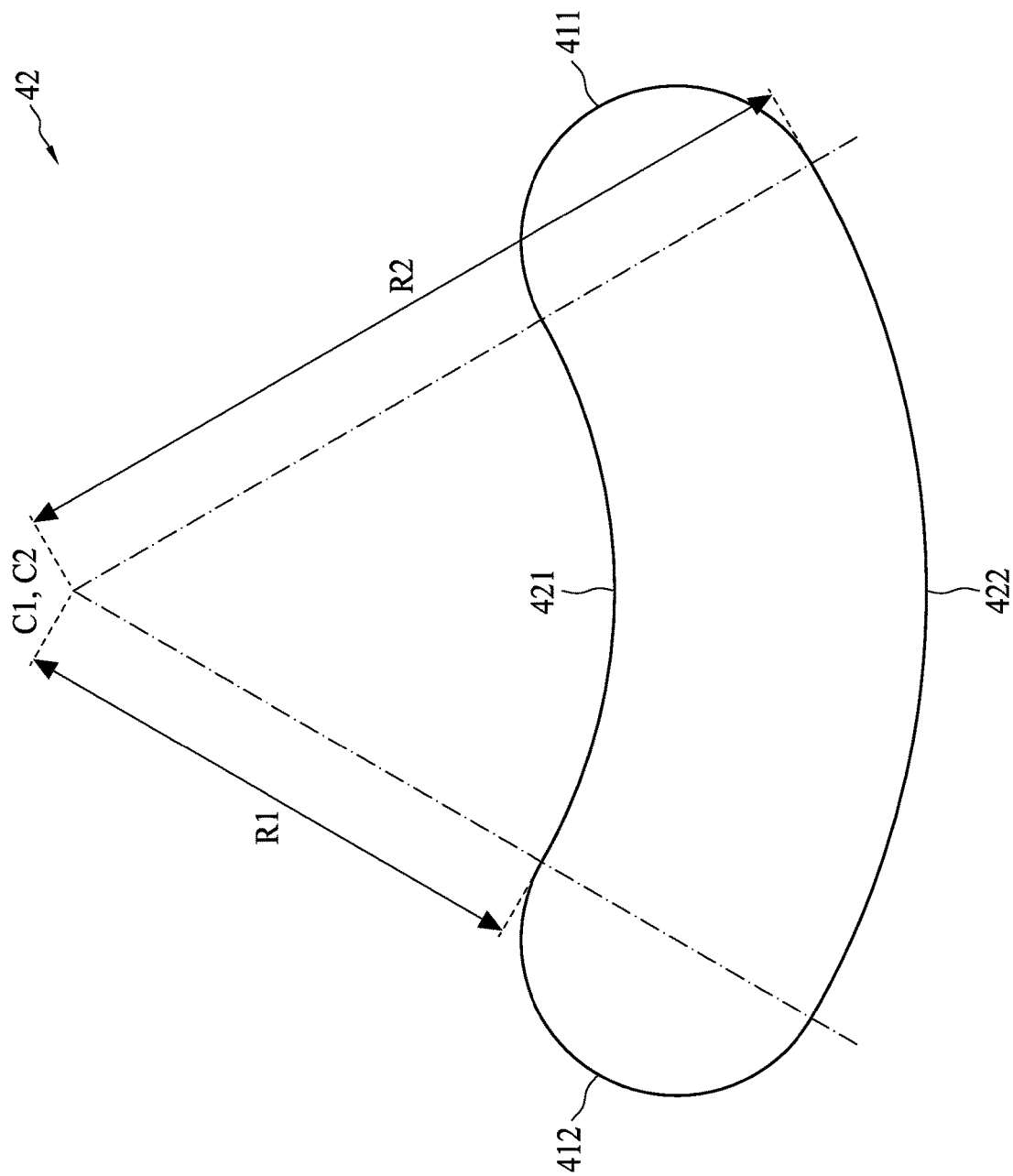
FIG. 5 is a schematic diagram illustrating a top view of a conductive pad according to some embodiments of the present disclosure.

FIG. 5 illustrates a top view of a conductive pad according to some embodiments of the present disclosure. FIG. 5 shows an outer boundary of the conductive pad 42. The outer boundary of the conductive pad 42 includes the concave side wall 421, the convex side wall 422, the end wall 411, and the end wall 412.

A center of curvature C1 of the concave side wall 421 and a center of curvature C2 of the convex side wall 422 fall on a same side of the conductive pad 42. In the embodiments of FIG. 5, the center of curvature C1 coincides with the center of curvature C2. In other embodiments, the center of curvature C1 and the center of curvature C2 do not coincide.

In some embodiments, the curve of the concave side wall 421 may represent an arc of a first circle, and the curve of the convex side wall 422 may represent an arc of a second circle having a radius R2 different from a radius R1 of the first circle. In the embodiments of FIG. 5, where the centers of curvature C1 and C2 coincide, R2 is greater than R1. In other embodiments, R1 may be greater than R2.

Although the concave side wall 421 and the convex side wall 422 have been described as having circle radii of R1 and R2, respectively, it should be understood that one or both of the centers of curvature C1 and C2 may represent centers of curvature of elliptical shapes instead. Further, one or both of the concave side wall 421 and the convex side wall 422 may be formed in curved shapes not defined by circle radii or elliptical shapes. A few examples of alternative structures are provided with respect to FIGS. 6–12 and related text, below.

The end wall 411 and the end wall 412 are convex. In some embodiments, a radius of curvature of the end wall 411 is substantially the same as a radius of curvature of the end wall 412. For example, in some embodiments, the end walls 411 and 412 each represent an arc of a semicircle having a radius of $(R2-R1)/2$. In some embodiments, the radius of curvature of the end wall 411 is different from the radius of curvature of the end wall 412.

Figure 6:
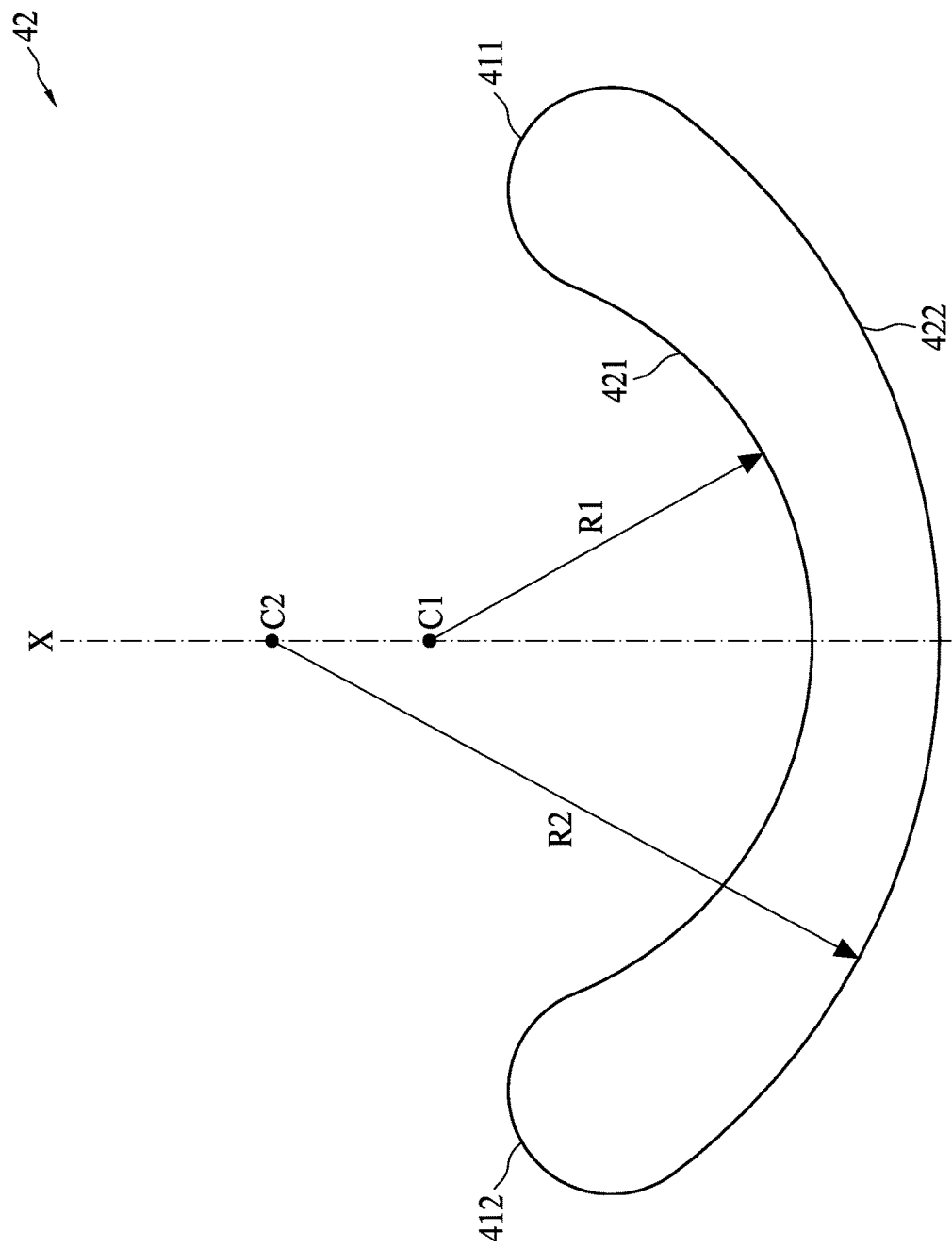
FIG. 6 is a schematic diagram illustrating a top view of a conductive pad according to some embodiments of the present disclosure.

FIG. 6 illustrates a top view of a conductive pad according to some embodiments of the present disclosure. The outer boundary of the conductive pad 42 in the embodiments shown in FIG. 6 is similar to the outer boundary illustrated and described with reference to the embodiments of FIG. 5, except that the center of curvature C1 of the concave side wall 421 and the center of curvature C2 of the convex side wall 422 are distributed on two different locations along a line of symmetry XX', and the center C1 of curvature is closer to the concave side wall 421 than is the center of curvature C2.

Figure 7:
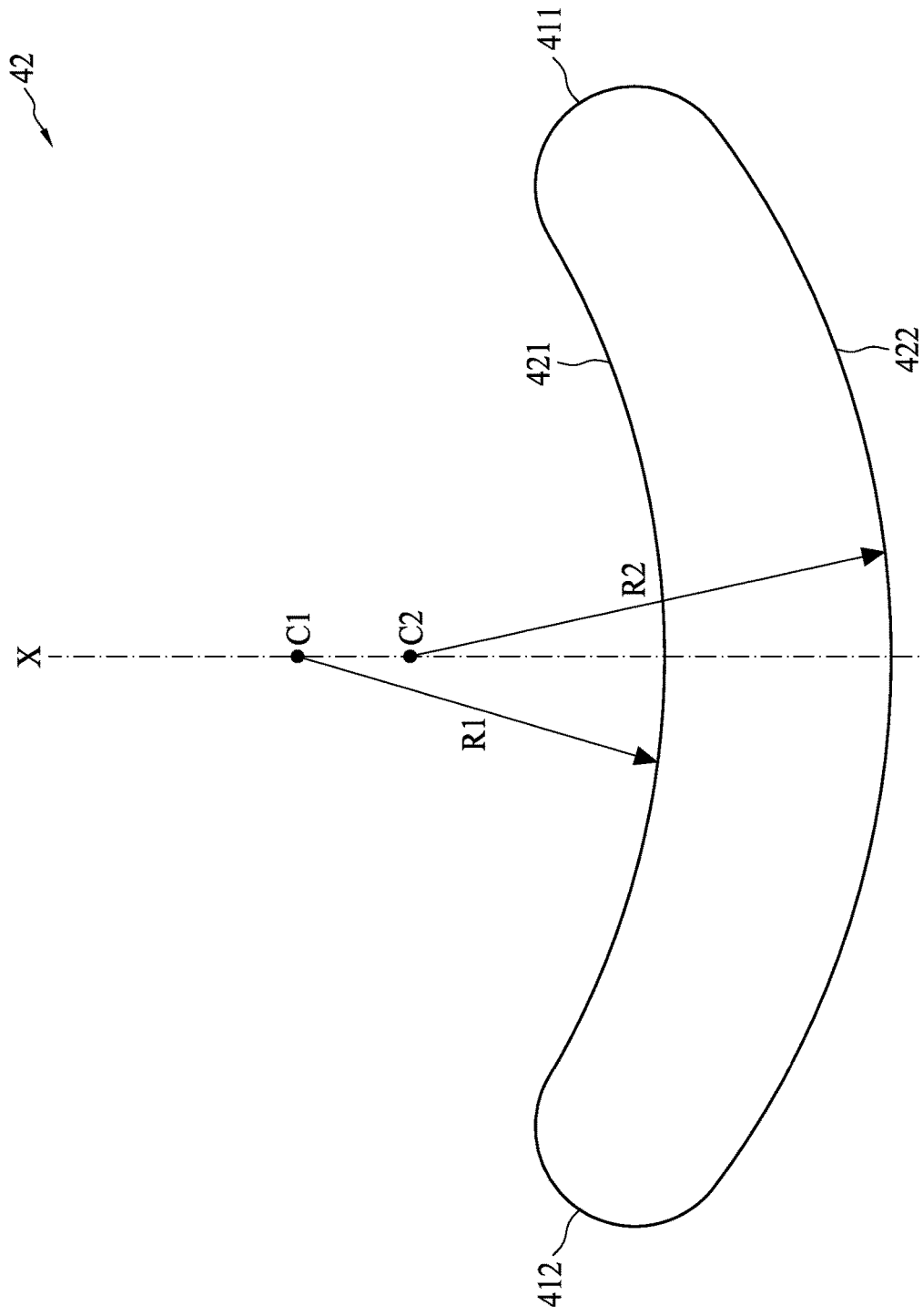
FIG. 7 is a schematic diagram illustrating a top view of a conductive pad according to some embodiments of the present disclosure.

FIG. 7 illustrates a top view of a conductive pad according to some embodiments of the present disclosure. The outer boundary of the conductive pad 42 in the embodiments shown in FIG. 7 is similar to the outer boundary illustrated and described with reference to the embodiments of FIG. 6, except that the center of curvature C2 is closer to the concave side wall 421 than is the center of curvature C1.

Figure 8:
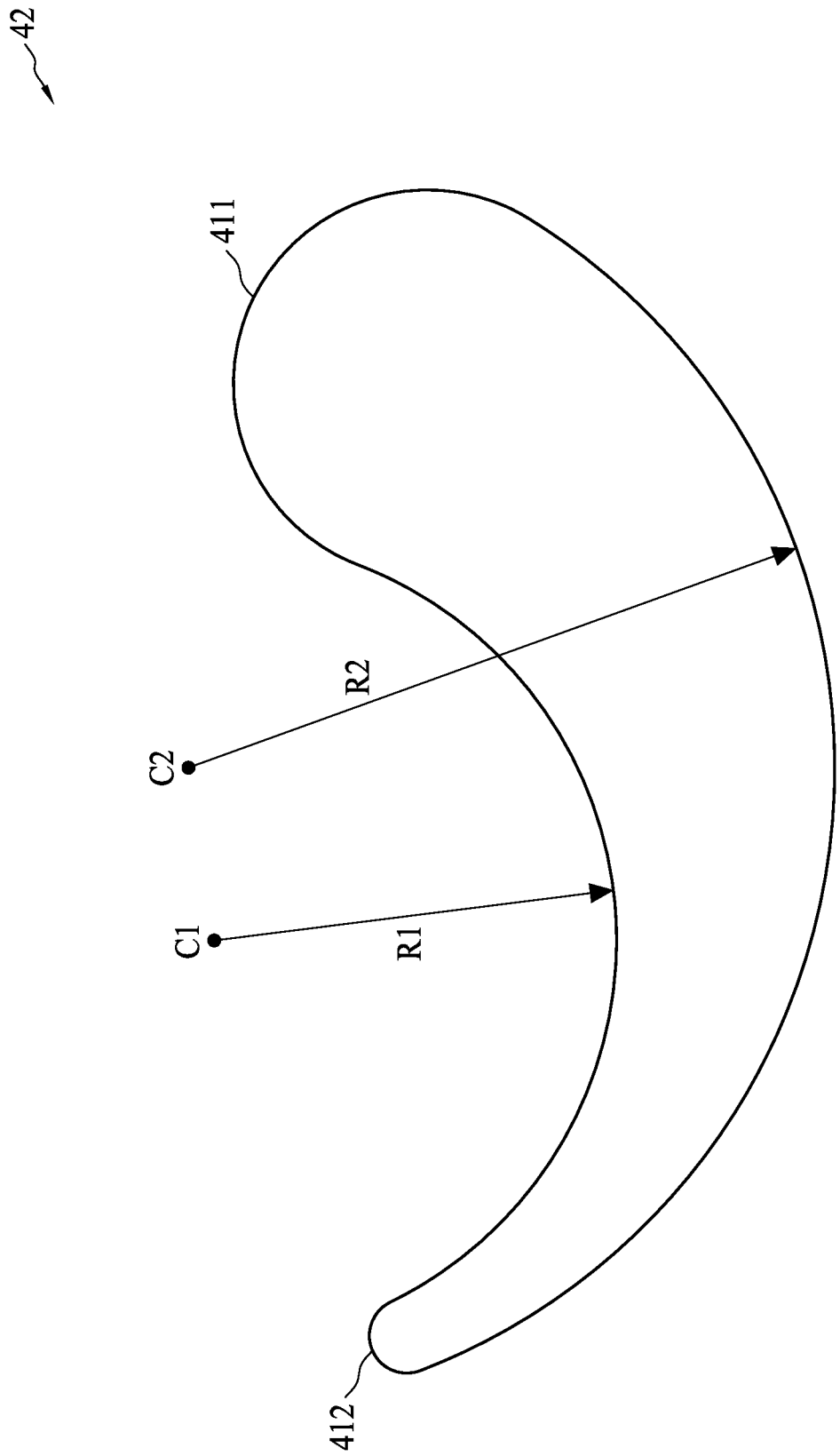
FIG. 8 is a schematic diagram illustrating a top view of a conductive pad according to some embodiments of the present disclosure.

FIG. 8 illustrates a top view of a conductive pad according to some embodiments of the present disclosure. The outer boundary of the conductive pad 42 in the embodiments shown in FIG. 8 is similar to the outer boundary illustrated and described with reference to the embodiments of FIG. 7, except that the radius of curvature of the end wall 411 is greater than the radius of curvature of the end wall 412 due to the asymmetry of the placement of the centers of curvature C1 and C2.

Figure 9:
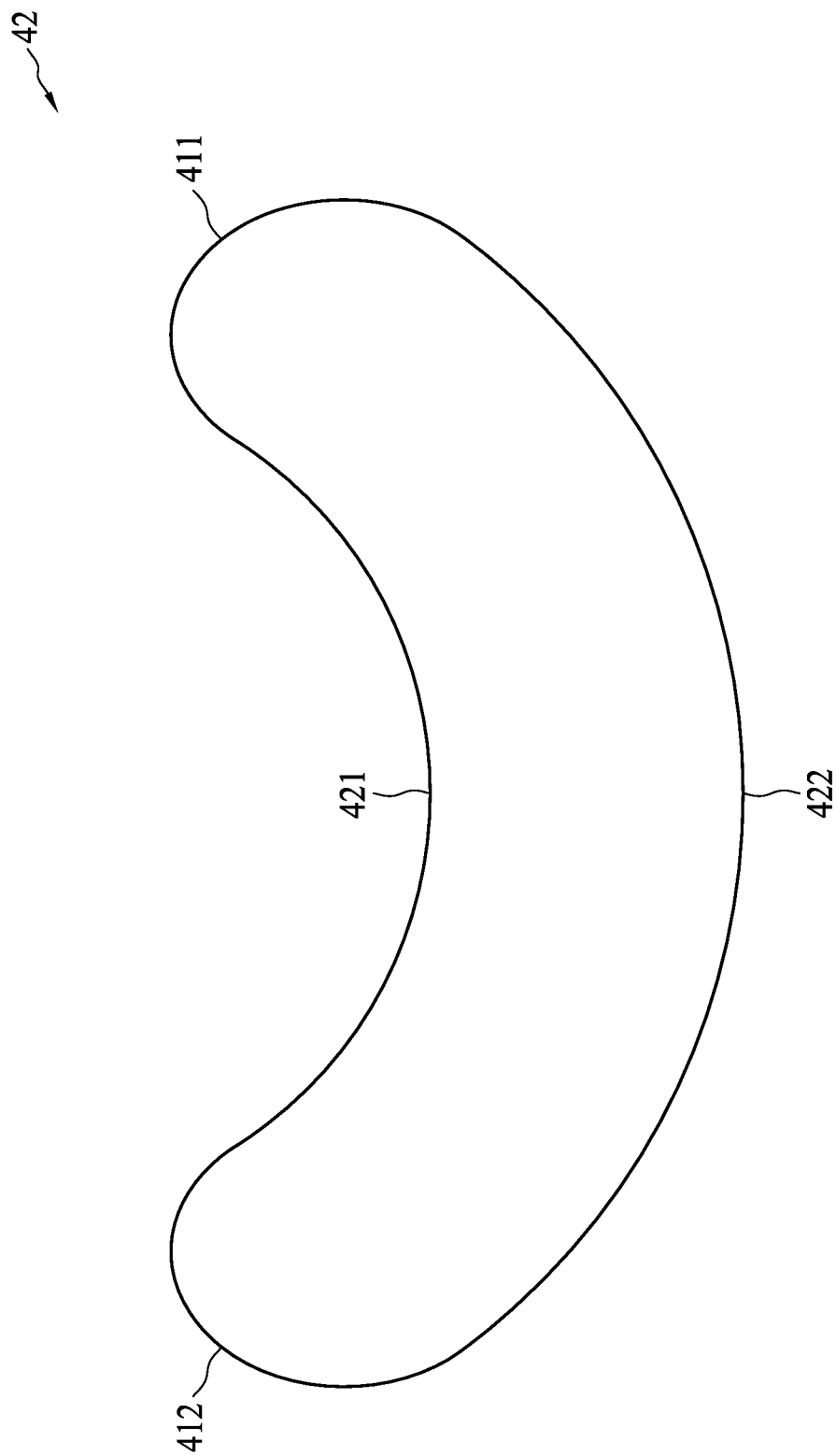
FIG. 9 is a schematic diagram illustrating a top view of a conductive pad according to some embodiments of the present disclosure.

FIG. 9 illustrates a top view of a conductive pad according to some embodiments of the present disclosure. The outer boundary of the conductive pad 42 in the embodiments shown in FIG. 9 is similar to the outer boundary illustrated and described with reference to the embodiments of FIG. 5, except that the respective radii of curvature and the respective locations of the centers of curvature of some or all of the concave side wall 421, the convex side wall 422, the end wall 411 and the end wall 412 are different than shown in FIG. 5.

Figure 10:
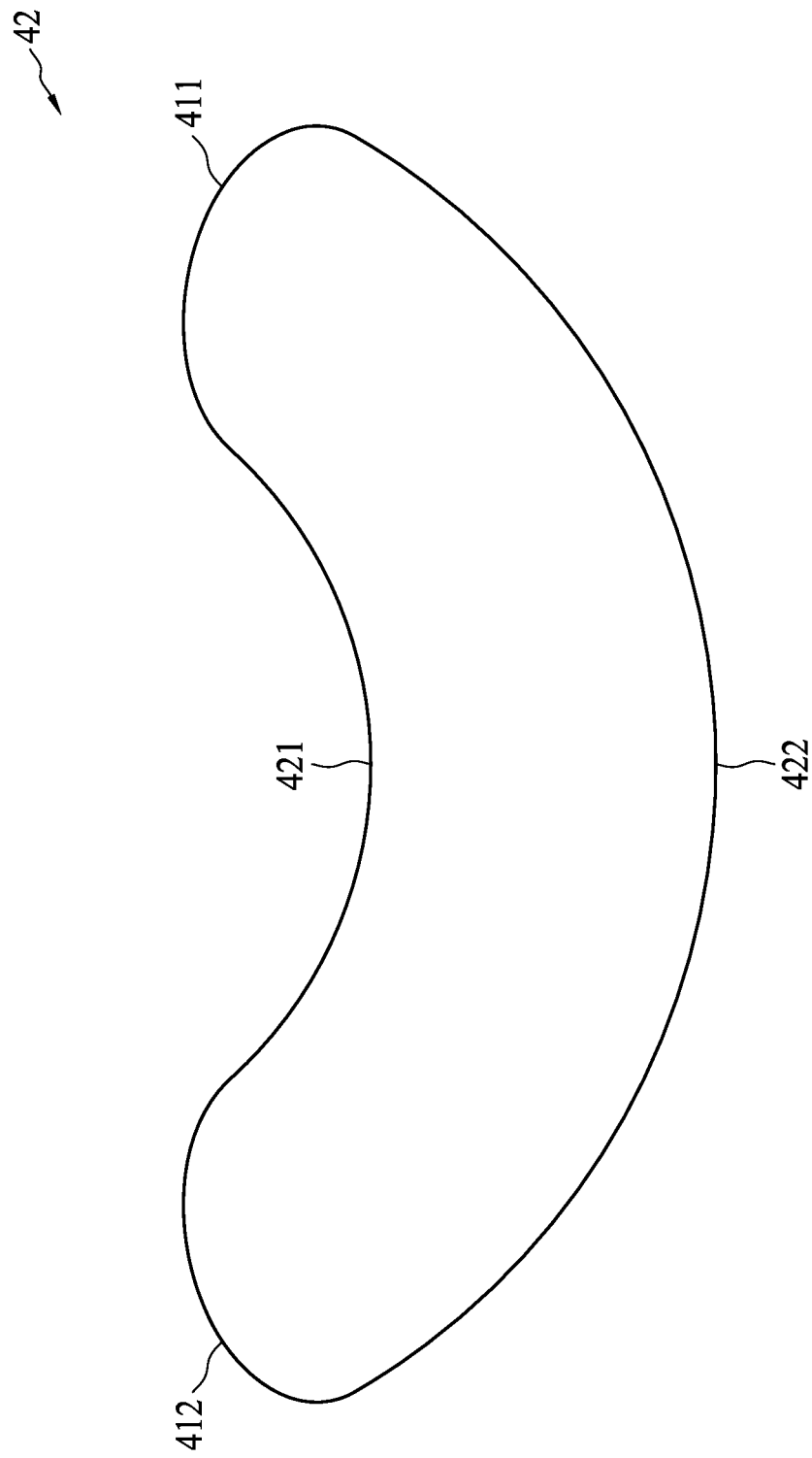
FIG. 10 is a schematic diagram illustrating a top view of a conductive pad according to some embodiments of the present disclosure.

FIG. 10 illustrates a top view of a conductive pad according to some embodiments of the present disclosure. The outer boundary of the conductive pad 42 in the embodiments shown in FIG. 10 is similar to the outer boundary illustrated and described with reference to the embodiments of FIG. 5, except that the respective radii of curvature and the respective locations of the centers of curvature of some or all of the concave side wall 421, the convex side wall 422, the end wall 411 and the end wall 412 are different than shown in FIG. 5.

Figure 11:
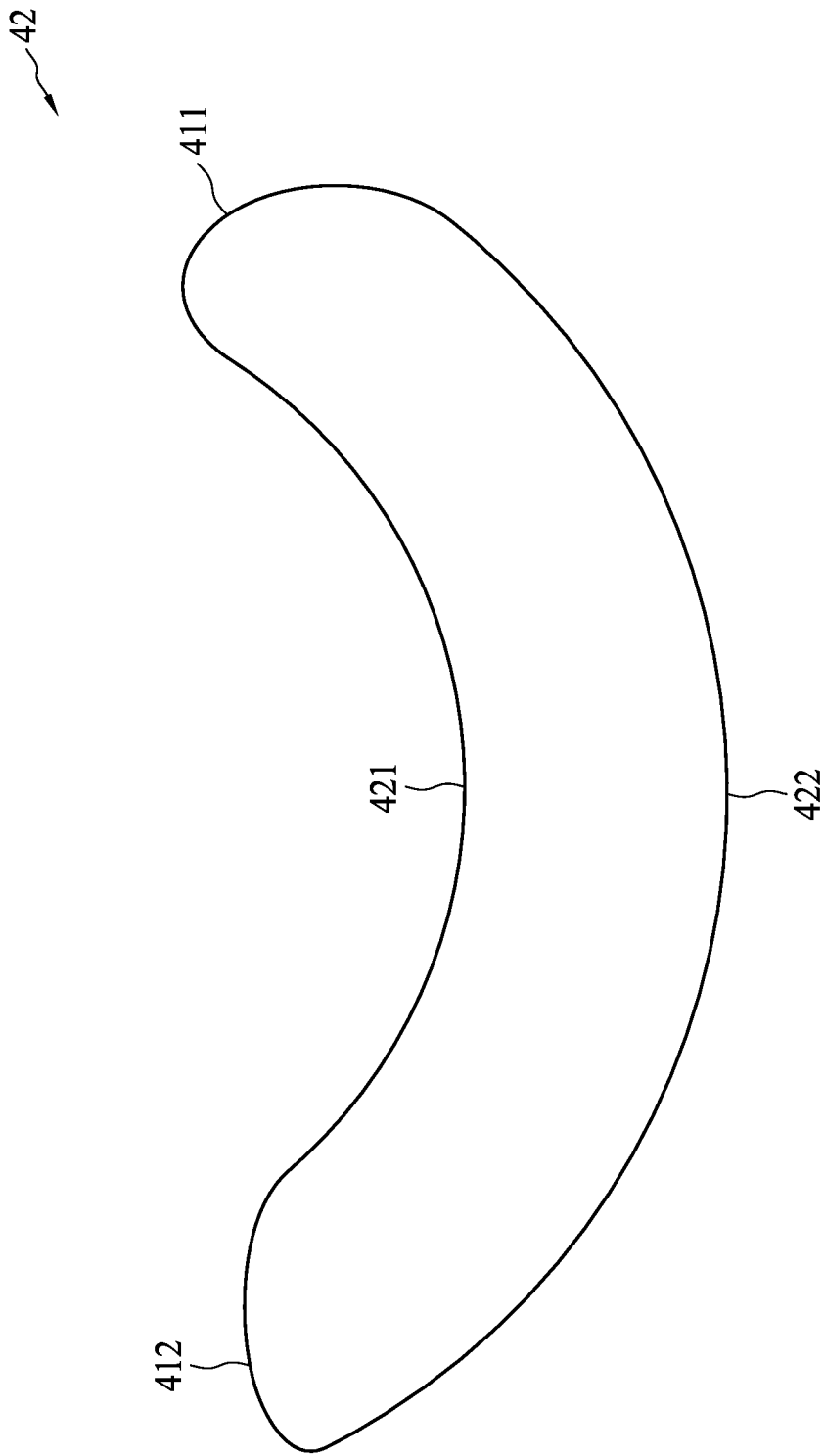
FIG. 11 is a schematic diagram illustrating a top view of a conductive pad according to some embodiments of the present disclosure.

FIG. 11 illustrates a top view of a conductive pad according to some embodiments of the present disclosure. The outer boundary of the conductive pad 42 in the embodiments shown in FIG. 11 is similar to the outer boundary illustrated and described with reference to the embodiments of FIG. 5, except that the respective radii of curvature and the respective locations of the centers of curvature of some or all of the concave side wall 421, the convex side wall 422, the end wall 411 and the end wall 412 are different than shown in FIG. 5.

Figure 12:
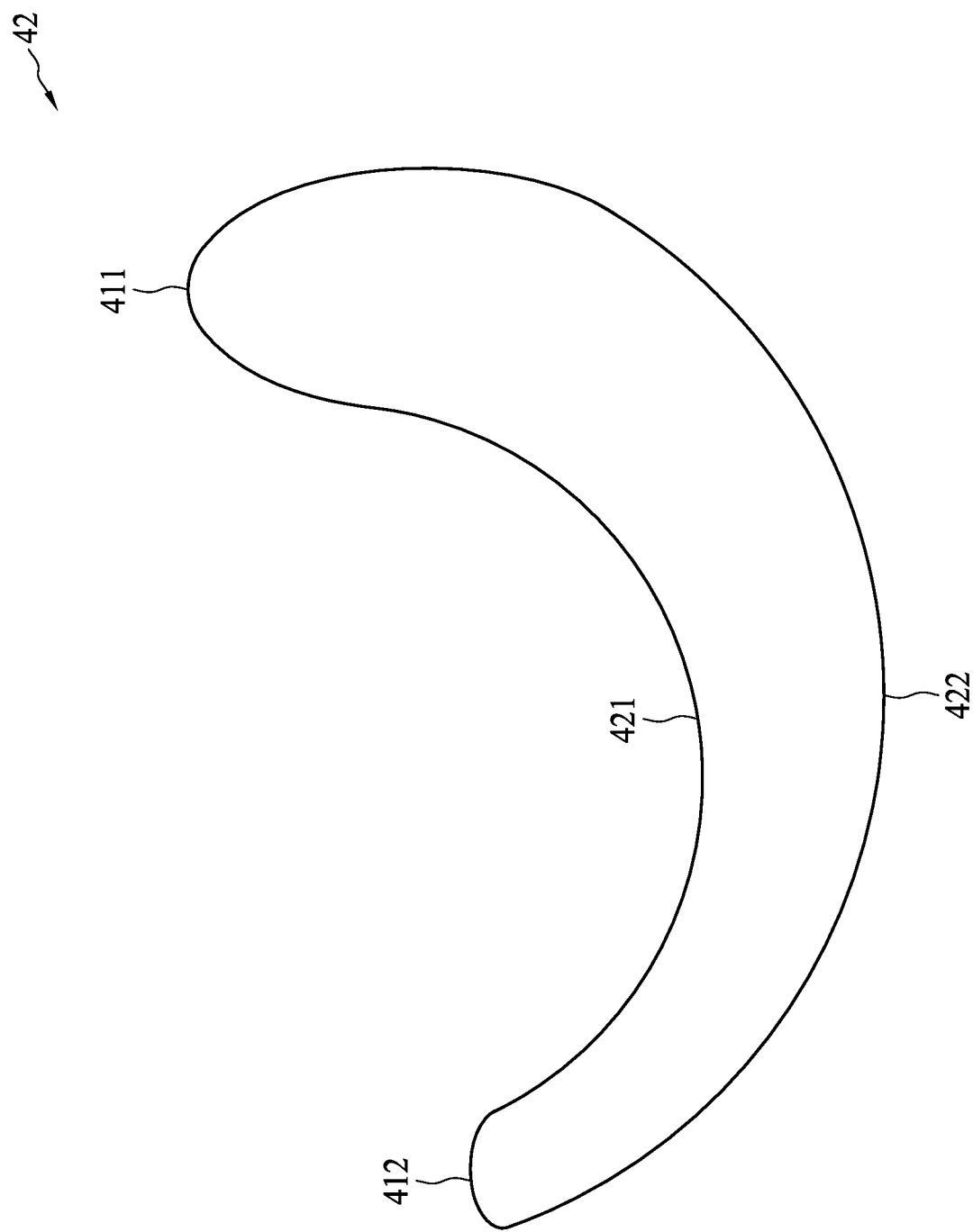
FIG. 12 is a schematic diagram illustrating a top view of a conductive pad according to some embodiments of the present disclosure.

FIG. 12 illustrates a top view of a conductive pad according to some embodiments of the present disclosure. The outer boundary of the conductive pad 42 in the embodiments shown in FIG. 12 is similar to the outer boundary illustrated and described with reference to the embodiments of FIG. 5, except that the respective radii of curvature and the respective locations of the centers of curvature of some or all of the concave side wall 421, the convex side wall 422, the end wall 411 and the end wall 412 are different than shown in FIG. 5.

Although the shape and outer boundary of the conductive pad 42 are described with reference to FIGS. 3-12, it should be understood that the conductive pad 16 may be arranged in a way and may have a shape and outer boundary similar to, or substantially the same as, those described with reference to FIGS. 3-12.

The contours or outer boundaries as illustrated and described with reference to FIG. 3, FIGS. 4A-4D, FIG. 5, FIG. 6, FIG. 7, FIG. 8, FIG. 9, FIG. 10, FIG. 11 and FIG. 12 may redistribute the mechanical and thermal stress experienced during assembly and operation of a substrate. Compared to a comparative conductive pad that has a circular shape or rectangular shape, the stress intensity factor of the conductive pads described with reference to FIG. 3, FIGS. 4A-4D, FIG. 5, FIG. 6, FIG. 7, FIG. 8, FIG. 9, FIG. 10, FIG. 11 and FIG. 12 can be reduced, for example, by up to about 78.86%, about 80%, or about 85%.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially equal to a second numerical value if the first numerical value lies within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" another component can encompass cases where the former component is directly on (e.g., in physical or direct contact with) the latter component, as well as cases where one or more intervening components are located between the former component and the latter component.

By "concentric" with respect to a first center of curvature represented by an arc of a first circle having a first radius and a second center of curvature represented by an arc of a second circle having a second radius, the term can encompass a displacement between the first center of curvature and the second center of curvature of a magnitude less than or equal to 10% of a smaller one of the first radius and the second radius, such as less than or equal to 5%, less than or equal to 4%, less than or equal to 3%, less than or equal to 2%, less than or equal to 1%, less than or equal to 0.5%, less than or equal to 0.1%, or less than or equal to 0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure, as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate, comprising:
   a dielectric layer;
   a patterned conductive layer adjacent to the dielectric layer, the patterned conductive layer comprising a first conductive pad, the first conductive pad comprising a first portion having a first concave sidewall, the first concave sidewall constituting an outer wall of the first conductive pad; and
   a protection layer disposed on the patterned conductive layer and covering the first portion of the first conductive pad.

2. The substrate of claim 1, wherein the patterned conductive layer further comprises a second conductive pad under the first conductive pad.

3. The substrate of claim 2, wherein a width of the second conductive pad is different from a width of the first conductive pad.

4. The substrate of claim 2, wherein a width of the second conductive pad is greater than a width of the first conductive pad.

5. The substrate of claim 2, wherein the protection layer comprises a step structure.

6. The substrate of claim 2, wherein the protection layer surrounds the first conductive pad.

7. The substrate of claim 2, wherein the protection layer is in contact with at least a portion of a sidewall of the first conductive pad.

8. The substrate of claim 1, further comprising a first area configured to receive a semiconductor device, wherein the first conductive pad is disposed within the first area.

9. The substrate of claim 8, wherein the patterned conductive layer further comprises a second conductive pad, the second conductive pad comprises a first portion having a first concave sidewall, and the protection layer covers the first portion of the second conductive pad, and wherein the first area has a geometric center, and wherein the first concave sidewall of the first conductive pad faces the geometric center and wherein the first concave sidewall of the second conductive pad faces the geometric center.

10. The substrate of claim 9, wherein a curvature center of the first concave sidewall of the first conductive pad and a curvature center of the first concave sidewall of the second conductive pad are concentric.

11. The substrate of claim 8, wherein the first conductive pad is disposed adjacent to a corner of the first area.

12. The substrate of claim 8, wherein the first area has a geometric center, and wherein the first conductive pad further comprises a first convex sidewall, and a distance from the first convex sidewall to the geometric center is greater than a distance from the first concave sidewall to the geometric center.

13. The substrate of claim 12, wherein a curvature center of the first convex sidewall and a curvature center of the first concave sidewall are non-concentric.

14. The substrate of claim 12, wherein a curvature center of the first convex sidewall and a curvature center of the first concave sidewall are concentric.

15. A semiconductor device package, comprising:
   a substrate comprising:
     a dielectric layer; and
     a patterned conductive layer adjacent to the dielectric layer, the patterned conductive layer comprising a first conductive pad, the first conductive pad comprising a first portion having a concave sidewall, the concave sidewall constituting an outer wall of the first conductive pad;
     a protection layer disposed on the patterned conductive layer and covering the first portion of the first conductive pad; and
   a semiconductor device on the substrate and electrically connected to the first conductive pad of the patterned conductive layer.

16. The semiconductor device package of claim 15, further comprising a conductive connection element electrically connected between the semiconductor device and the first conductive pad of the patterned conductive layer.

17. The semiconductor device package of claim 15, wherein the protection layer comprises a resin and fillers.

18. The semiconductor device package of claim 15, wherein the protection layer comprises a resin.

19. The semiconductor device package of claim 15, wherein the semiconductor device has a dimension equal to or greater than about 450 square millimeter ($mm^2$).

20. The semiconductor device package of claim 15, wherein the first conductive pad further comprises a convex sidewall, and wherein the concave sidewall has a curvature center and the convex sidewall has a curvature center, and the curvature center of the concave sidewall and the curvature center of the convex sidewall are disposed at a same side of the first conductive pad.

21. The semiconductor device package of claim 15, wherein the substrate further comprises a first area configured to receive the semiconductor device, and wherein the first conductive pad is disposed within the first area.

22. The semiconductor device package of claim 21, wherein the patterned conductive layer further comprises a second conductive pad, the second conductive pad comprises a first portion having a concave sidewall, and wherein the first area has a geometric center, and wherein the concave sidewall of the first conductive pad faces the geometric center and wherein the concave sidewall of the second conductive pad faces the geometric center.

23. The semiconductor device package of claim 22, wherein a curvature center of the concave sidewall of the first conductive pad and a curvature center of the concave sidewall of the second conductive pad are concentric.

24. The semiconductor device package of claim 21, wherein the first conductive pad is disposed adjacent to a corner of the first area.

25. The semiconductor device package of claim 21, wherein the first area has a geometric center, and wherein the first conductive pad further comprises a convex sidewall, and a distance from the convex sidewall of the first conductive pad to the geometric center is greater than a distance from the concave sidewall of the first conductive pad to the geometric center.

* * * * *